(12) United States Patent
Parimi et al.

(10) Patent No.: US 11,682,544 B2
(45) Date of Patent: Jun. 20, 2023

(54) COVER WAFER FOR SEMICONDUCTOR PROCESSING CHAMBER

(71) Applicant: Applied Materials, Inc., Santa Clara, CA (US)

(72) Inventors: Venkata Sharat Chandra Parimi, Sunnyvale, CA (US); Satish Radhakrishnan, San Jose, CA (US); Diwakar Kedlaya, San Jose, CA (US); Fang Ruan, Milpitas, CA (US); Amit Bansal, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/076,639

(22) Filed: Oct. 21, 2020

(65) Prior Publication Data
US 2022/0122822 A1 Apr. 21, 2022

(51) Int. Cl.
*H01J 37/32* (2006.01)
*B08B 7/00* (2006.01)

(52) U.S. Cl.
CPC ...... *H01J 37/32862* (2013.01); *B08B 7/0035* (2013.01); *H01J 37/32715* (2013.01)

(58) Field of Classification Search
CPC .......... H01J 37/32862; H01J 37/32715; B08B 7/0035
See application file for complete search history.

(56) References Cited

U.S. PATENT DOCUMENTS

| 2002/0034595 A1* | 3/2002 | Tometsuka ............ C23C 16/463 438/758 |
| 2004/0069412 A1 | 4/2004 | Inomata et al. |
| 2004/0163669 A1* | 8/2004 | Brueckner ................ C23F 1/36 134/28 |

(Continued)

FOREIGN PATENT DOCUMENTS

| JP | H10-284475 A | 10/1998 |
| JP | 2002-170823 A | 6/2002 |

(Continued)

OTHER PUBLICATIONS

International Search Report and Written Opinion dated Feb. 8, 2022 in International Patent Application No. PCT/US2021/055321, 7 pages.

*Primary Examiner* — Erin F Bergner
(74) *Attorney, Agent, or Firm* — Kilpatrick Townsend & Stockton LLP

(57) ABSTRACT

Semiconductor processing systems according to embodiments of the present technology may include a chamber body having sidewalls and a base. The chamber body may define an internal volume. The systems may include a substrate support assembly having a shaft and a platen coupled with the shaft along a first surface of the platen. The semiconductor processing systems may include a cover plate positioned on the platen of the substrate support assembly along a second surface of the platen opposite the first surface. The cover plate may include a flange extending about an exterior region of the cover plate. The flange may (Continued)

be in direct contact with the platen. The cover plate may include an upper wall vertically offset from the flange. An interior volume may be defined between the upper wall and the platen of the substrate support assembly.

19 Claims, 6 Drawing Sheets

(56) References Cited

U.S. PATENT DOCUMENTS

| | | | |
|---|---|---|---|
| 2014/0318575 A1* | 10/2014 | Parkhe | H01J 37/32862 |
| | | | 279/157 |
| 2015/0376780 A1 | 12/2015 | Khaja et al. | |
| 2020/0234982 A1 | 7/2020 | Basu et al. | |

FOREIGN PATENT DOCUMENTS

| | | | |
|---|---|---|---|
| KR | 2019-0129363 A | 11/2019 | |
| TW | 201126601 A | 8/2011 | |

\* cited by examiner

COVER WAFER FOR SEMICONDUCTOR PROCESSING CHAMBER

TECHNICAL FIELD

The present technology relates to components and apparatuses for semiconductor manufacturing. More specifically, the present technology relates to processing chamber components and other semiconductor processing equipment.

BACKGROUND

Integrated circuits are made possible by processes which produce intricately patterned material layers on substrate surfaces. Producing patterned material on a substrate requires controlled methods for forming and removing material. Material may remain in the chamber after a processing operation, including residual deposition or etching material, as well as processing byproducts. Cleaning operations may be performed to remove production materials, but these processes may produce additional challenges on exposed chamber surfaces. Thus, there may be a desire for improved systems and methods that can be used to produce high quality devices and structures.

SUMMARY

Semiconductor processing systems according to embodiments of the present technology may include a chamber body having sidewalls and a base. The chamber body may define an internal volume. The systems may include a substrate support assembly having a shaft and a platen coupled with the shaft along a first surface of the platen. The substrate support assembly may extend through the base of the chamber body. The substrate support assembly may be configured to support a substrate within the internal volume. The semiconductor processing systems may include a cover plate positioned on the platen of the substrate support assembly along a second surface of the platen opposite the first surface. The cover plate may include a flange extending about an exterior region of the cover plate. The flange may be in direct contact with the platen. The cover plate may include an upper wall vertically offset from the flange. An interior volume may be defined between the upper wall and the platen of the substrate support assembly.

In some embodiments, the cover plate may be composed of the same material as the substrate support assembly. The interior volume may be characterized by a height of less than or about 5 mm. The flange may include at least one protrusion extending from the flange and configured to contact the platen of the substrate support assembly. The flange may be characterized by a height of less than or about 50% of the height of the interior volume. The at least one protrusion may be characterized by a height of less than or about 0.5 mm. The systems may include a shadow ring. On engagement of the shadow ring with the substrate support assembly, the shadow ring may be maintained free of contact with the flange of the cover plate. The cover plate may further define an aperture through the cover plate along a sidewall of the cover plate. The upper wall may be characterized by a thickness of less than or about 2 mm.

Some embodiments of the present technology may encompass semiconductor processing chamber cover plates. The cover plates may include a flange extending about an exterior region of the cover plate. The flange may define a plurality of protrusions extending from a first surface of the flange. The cover plates may include an upper wall vertically offset from the flange. An interior volume may be defined by the cover plate recessed from the first surface of the flange.

In some embodiments, the cover plate may be or include a ceramic. The interior volume may be characterized by a height of less than or about 1.0% of a length of the cover plate. The flange may be characterized by a height of less than or about 50% of the height of the interior volume. The plurality of protrusions may be characterized by a height of less than or about 1 mm. The cover plates may include an aperture defined through the cover plate along a sidewall of the cover plate. The aperture may be characterized by a diameter less than or about 50% of a height of the interior volume.

Some embodiments of the present technology may encompass methods of semiconductor processing. The methods may include removing a processed substrate from a processing chamber. The processing chambers may include a faceplate and a substrate support assembly on which the processed substrate was disposed. The methods may include positioning a cover plate on the substrate support assembly. The cover plate may include a flange extending about an exterior region of the cover plate. The flange may be in direct contact with a platen of the substrate support assembly. The cover plate may include an upper wall vertically offset from the flange. An interior volume may be defined between the upper wall and the platen of the substrate support assembly. The methods may include cleaning the chamber with plasma effluents of a halogen-containing precursor.

In some embodiments, the methods may include raising the substrate support assembly. The methods may include engaging a shadow ring with the substrate support assembly. The shadow ring may be maintained free of contact with the cover plate. The cover plate may include an aperture defined through the cover plate along a sidewall of the cover plate. The aperture may be characterized by a diameter less than or about 50% of a height of the interior volume. The interior volume may be characterized by a height of less than or about 1.0% of a length of the cover plate. The cover plate may be composed of the same material as the platen of the substrate support assembly. The flange may include at least one protrusion extending from the flange and configured to contact the platen of the substrate support assembly. The flange may be characterized by a height of less than or about 50% of the height of the interior volume. The at least one protrusion may be characterized by a height of less than or about 1 mm.

Such technology may provide numerous benefits over conventional systems and techniques. For example, embodiments of the present technology may mitigate or eliminate build-up of contaminants, such as halogen-based deposits, on the semiconductor substrate support. Additionally, using the components described in the various embodiments of the present technology may increase the repeatability of processes performed by the semiconductor processing system. These and other embodiments, along with their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

Figure 1:
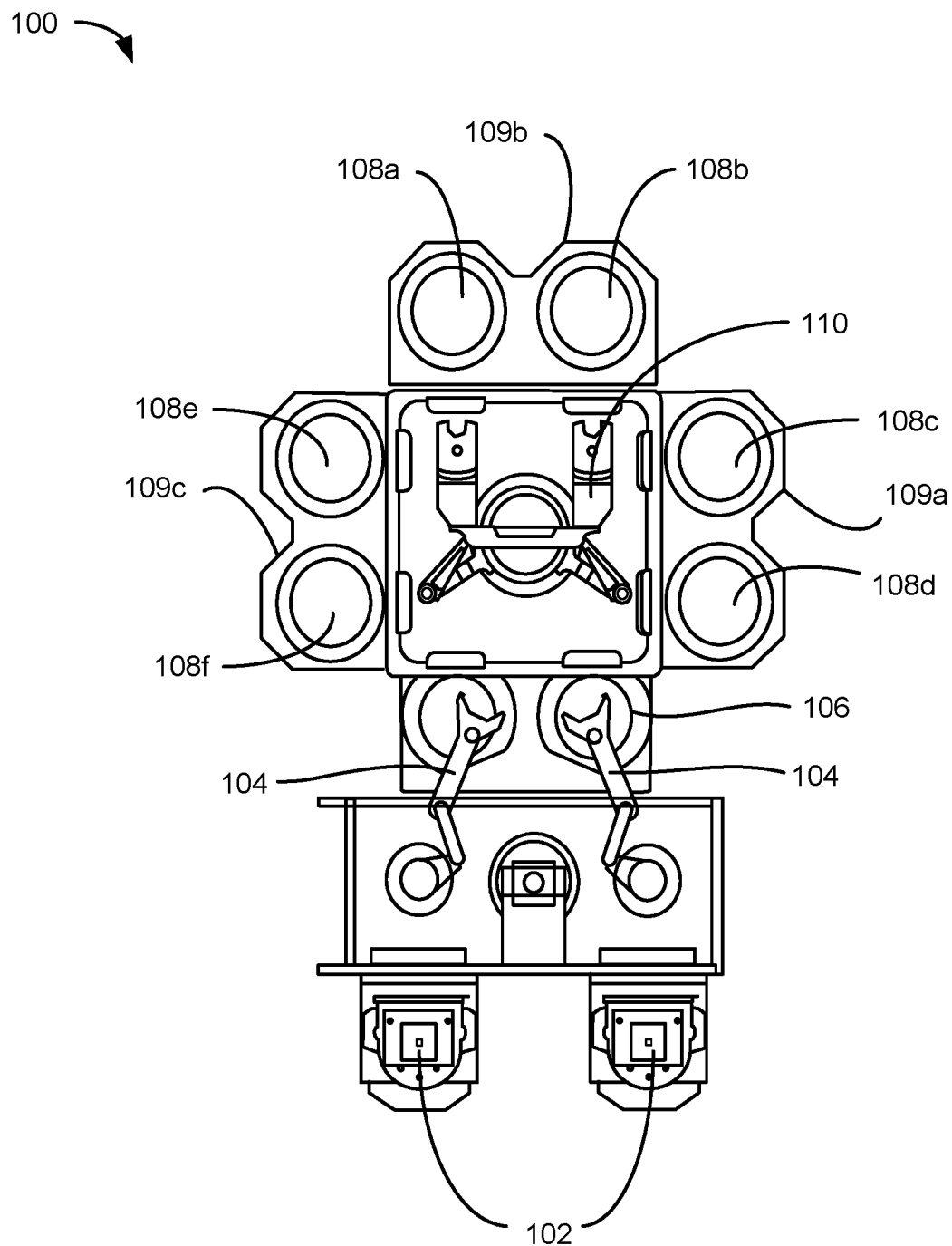
FIG. 1 shows a schematic top view of an exemplary semiconductor processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hard mask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. While components of the lid stack may impact flow distribution into the processing chamber, many other process variables may similarly impact uniformity of deposition.

As device features reduce in size, tolerances across a substrate surface may be reduced, and material property differences across a film may affect device realization and uniformity. Many chambers include a characteristic process signature, which may produce non-uniformity across a substrate. Temperature differences, flow pattern uniformity, and other aspects of processing may impact the films on the substrate, creating film uniformity differences across the substrate for materials produced or removed. Additionally, cleaning operations may utilize reactive materials to remove residual material within the processing region of the chamber. However, this may have an exaggerated impact on surfaces exposed once the substrate is removed from the processing chamber.

For example, upon completion of a production cycle, the processed substrate may be removed from the semiconductor processing chamber. A cleaning process may then be performed to remove deposition products from chamber surfaces. This process may involve flowing plasma effluents of one or more halogen-containing gases into the semiconductor processing chamber. Although the cleaning materials may remove residual materials on chamber surfaces, the halogen effluents may also interact with the exposed surface of the substrate support where the substrate had been seated during processing. Over time, these halogen effluents may erode the exposed surface of the substrate support, which may cause electrical, thermal, or mechanical effects on the substrate support, which may reduce uniformity of processing on substrates over time.

Conventional technologies may attempt to reduce this impact by forming a seasoning on the chamber surfaces, including the substrate support. However, because a substrate support is regularly the hottest component in the processing chamber, seasoning may be removed preferentially across the surface, which may then expose the surface to harsher cleaning materials. Additionally, seasoning does not address the overlying materials on other chamber surfaces where the substrate may limit deposition across a surface of the substrate support. Consequently, additional damage to the substrate support may occur. Because the substrate support may be aluminum nitride, or some other aluminum-containing material, aluminum halide particles may be generated, such as aluminum fluoride. These particles may build up and sublimate at higher temperature processing operations, and then condense on cooler chamber components including liners and showerheads. This may impact flow profiles, and cause fall-on particles in subsequent processing, increasing drift in processing over time.

The present technology overcomes these deficiencies by introducing a cover plate onto the substrate support once the substrate has been removed. The cover plate may be characterized by features that reduce or eliminate alternative contaminant build-up during cleaning processes in the semiconductor processing system. The cover plate may operate as a thermal choke, which may help to limit temperature effects from the substrate support. By utilizing cover plates according to embodiments of the present technology, cleaning operations may be performed that limit an impact on a substrate support, and which may improve process uniformity between substrates. Additionally, seasoning operations may be limited or reduced when cover plates are used, which may improve throughput in processing chambers.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The technology will discuss one possible system and chamber that may include components according to embodiments of the present technology before additional variations and adjustments to this system according to embodiments of the present technology are described.

FIG. 1 shows a top-view of one embodiment of a processing system 100 of deposition, etching, baking, and curing chambers according to various embodiments. In the figure, a pair of front opening unified pods 102 supply substrates of a variety of sizes that may be received by robotic arms 104 and placed into a low-pressure holding area 106 before being placed into one of the substrate processing chambers 108, positioned in tandem sections 109. A second robotic arm 110 may be used to transport the substrate wafers from the low-pressure holding area 106 to the substrate processing chambers 108 and back. Each substrate processing chamber 108, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc. The substrate processing chambers 108 may include one or more system components for depositing, annealing, curing, etching a dielectric or other film on the substrate, or a combination thereof. In one configuration, two pairs of the processing chambers, e.g., 108c-108d and 108e-108f, may be used to deposit dielectric material on the substrate, and the third pair of processing chambers, e.g., 108a-108b, may be used to etch the deposited dielectric. In another configuration, all three pairs of chambers, e.g., 108a-108f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by the processing system 100.

Figure 2:
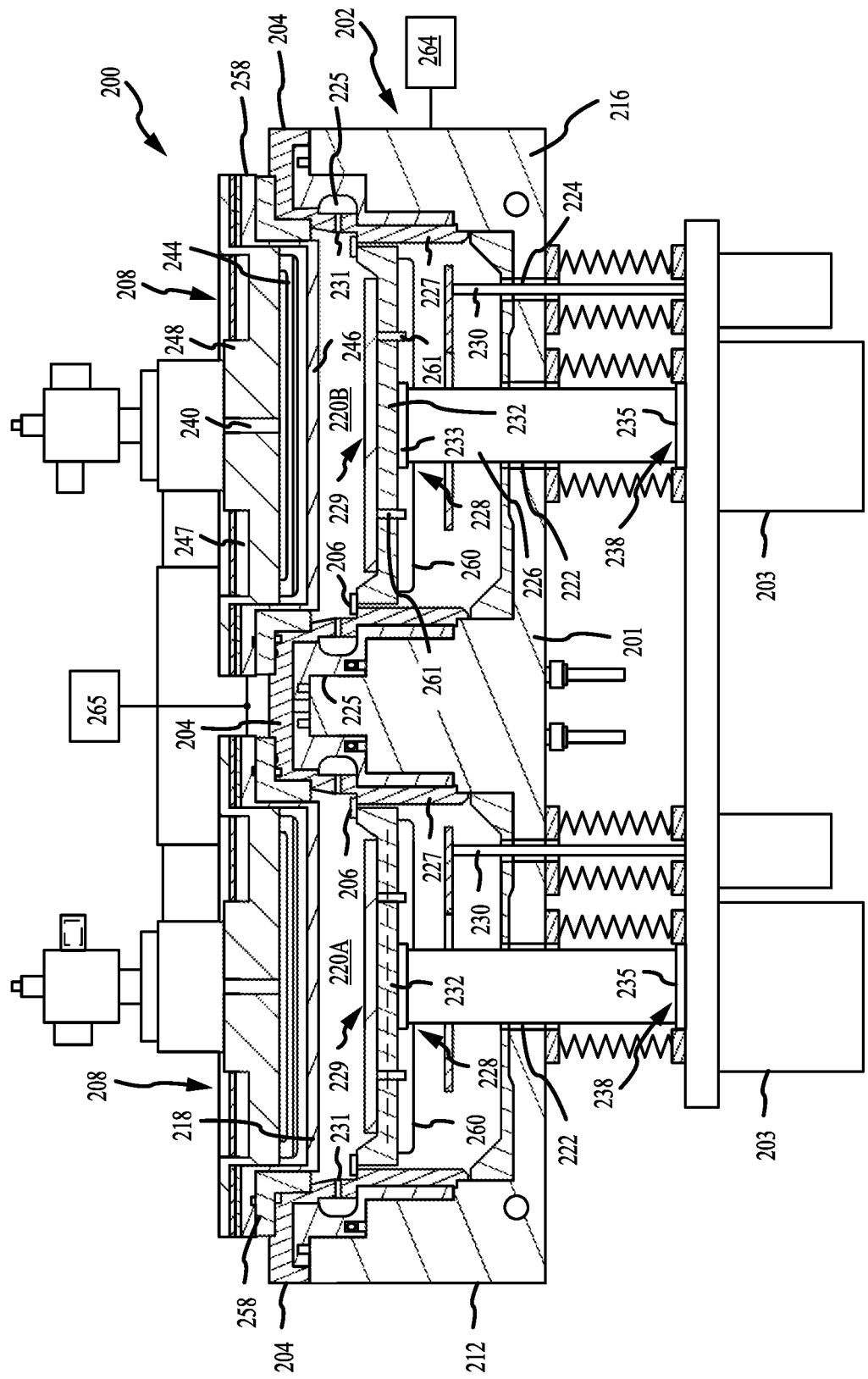
FIG. 2 shows a schematic cross-sectional view of an exemplary plasma system according to some embodiments of the present technology.

FIG. 2 shows a schematic cross-sectional view of an exemplary plasma system 200, according to some embodiments of the present technology. The plasma system 200 may illustrate a pair of substrate processing chambers 108 that may be fitted in one or more of tandem sections 109 described above, and which may include substrate supports or other components or assemblies according to various embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components. For example, the processing region 220B, the components of which may also be included in the processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements that may heat and control the substrate temperature at a desired process temperature. The pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260. A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gas box 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gas box 248 of the gas distribution system 208 to cool the gas box 248 during operation. A heat transfer fluid, such as water, ethylene glycol, a gas, or the like, may be circulated through the cooling channel 247 such that the gas box 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
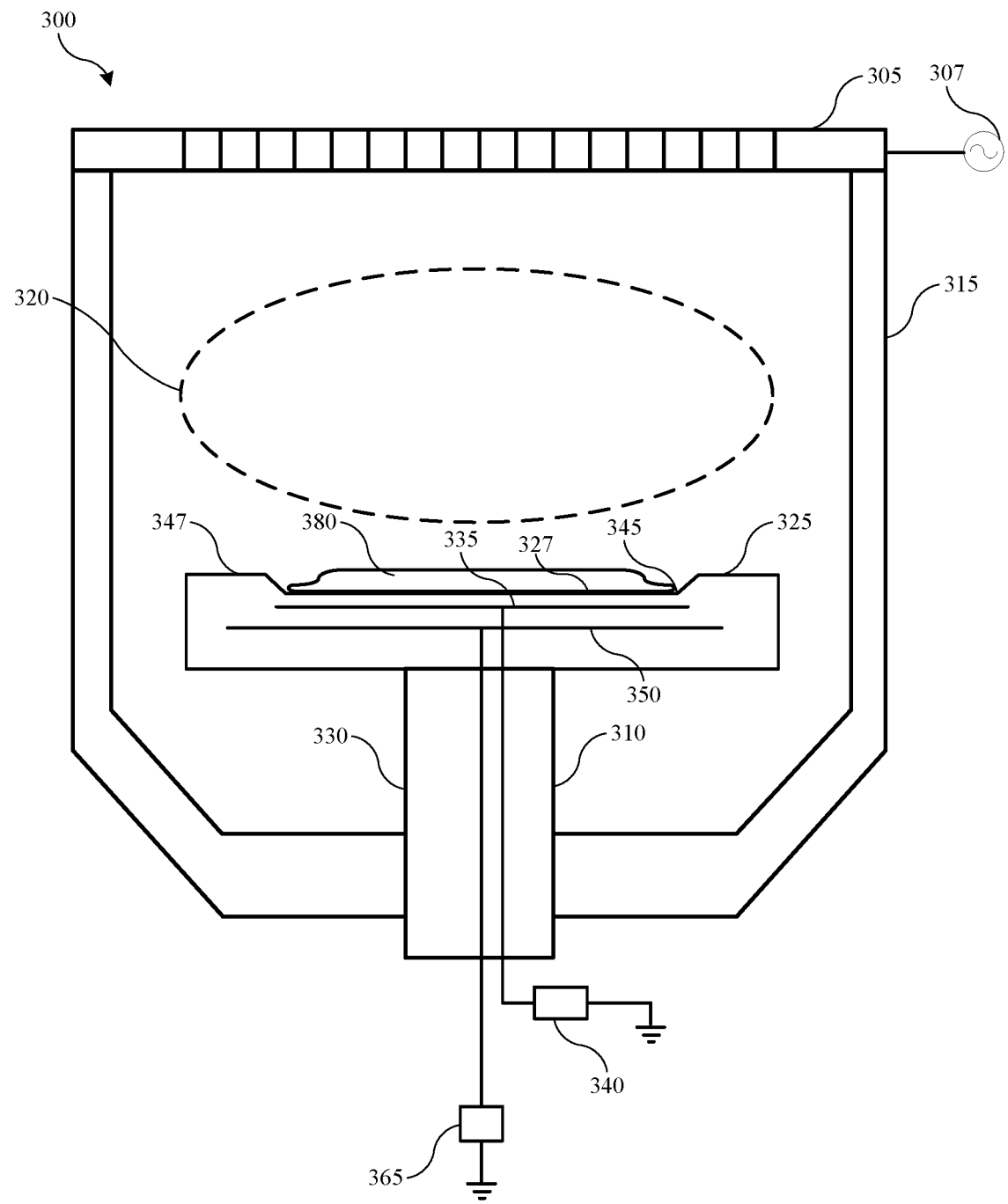
FIG. 3 shows a schematic partial cross-sectional view of an exemplary processing chamber according to some embodiments of the present technology.

FIG. 3 shows a schematic partial cross-sectional view of an exemplary semiconductor processing chamber 300 of a semiconductor processing system, according to some embodiments of the present technology. FIG. 3 may include one or more components discussed above with regard to FIG. 2, and may illustrate further details relating to that chamber. The chamber 300 may be used to perform semiconductor processing operations including deposition dielectric or hardmask materials as previously described. The chamber 300 may show a partial view of a processing region of a semiconductor processing system, and may not include all of the components, such as additional lid stack components previously described, which are understood to be incorporated in some embodiments of the chamber 300.

As noted, FIG. 3 may illustrate a portion of a processing chamber 300. The chamber 300 may include a showerhead 305, as well as a substrate support assembly 310. Along with chamber sidewalls 315, the showerhead 305 and the substrate support assembly 310 may define a substrate processing region 320 in which plasma may be generated. The substrate support assembly may include an electrostatic chuck body 325 that may include one or more components embedded or disposed within the chuck body 325. The components incorporated within the top puck may not be exposed to processing materials in some embodiments and may be fully retained within the chuck body 325. The chuck body 325 may define a substrate support surface 327 and may be characterized by a thickness and length or diameter depending on the specific geometry of the chuck body 325. In some embodiments, the chuck body 325 may be elliptical and may be characterized by one or more radial dimensions from a central axis through the chuck body 325. It is to be understood that the top puck may be any geometry, and when radial dimensions are discussed, they may define any length from a central position of the chuck body.

The electrostatic chuck body 325 may be coupled with a stem 330 that may support the chuck body 325 and may include channels as will be discussed below for delivering and receiving electrical and/or fluid lines that may couple with internal components of the chuck body 325. The chuck body 325 may include associated channels or components to operate as an electrostatic chuck, although in some embodiments the assembly may operate as or include components for a vacuum chuck, or any other type of chucking system. The stem 330 may be coupled with the chuck body 325 on a second surface of the chuck body opposite the substrate support surface. The electrostatic chuck body 325 may include an electrode 335, which may be a DC electrode, embedded within the chuck body 325 proximate the substrate support surface 327. The electrode 335 may be electrically coupled with a power source 340. The power source 340 may be configured to provide energy or voltage to the electrically conductive chuck electrode 335. This may be operated to form a plasma of a precursor within the processing region 320 of the semiconductor processing chamber 300, although other plasma operations may similarly be sustained. For example, the electrode 335 may additionally be a chucking mesh that operates as electrical ground for a capacitive plasma system including an RF source 307 electrically coupled with the showerhead 305. For example, the electrode 335 may operate as a ground path for RF power from the RF source 307 while also operating as an electric bias to the substrate to provide electrostatic clamping of the substrate to the substrate support surface 327. The power source 340 may include a filter, a power supply, and a number of other electrical components configured to provide a chucking voltage.

The chuck body 325 may also define a recessed region 345 within the substrate support surface 327, which may provide a recessed pocket in which a substrate may be disposed. The recessed region 345 may be formed at an interior region of the top puck and may be configured to receive a substrate for processing. The recessed region 345 may encompass a central region of the electrostatic chuck body 325, as illustrated, and may be sized to accommodate any variety of substrate sizes. A substrate may be seated within the recessed region 345, and contained by an exterior region 347, which may encompass the substrate. In some embodiments, the height of the exterior region 347 may be such that a substrate is level with or recessed below a surface height of the substrate support surface at the exterior region 347. A recessed surface may control edge effects during processing, which may improve uniformity of deposition across the substrate in some embodiments. In some embodiments, an edge ring may be disposed about a periphery of the top puck, and may at least partially define the recess within which a substrate may be seated. In some embodiments, the surface of the chuck body 325 may be substantially planar, and the edge ring may fully define the recess within which the substrate may be seated.

In some embodiments the electrostatic chuck body 325 and/or the stem 330 may be insulating materials or dielectric materials. For example, oxides, nitrides, carbides, or other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulating materials or dielectric materials. Different grades of ceramic materials may be used to provide composites configured to operate at particular temperature ranges, and thus, different ceramic grades of similar materials may be used for the top puck and stem in some embodiments. Dopants may be incorporated in some embodiments to adjust electrical properties as will be explained further below. Exemplary dopant materials may include yttrium, magnesium, silicon, iron, calcium, chromium, sodium, nickel, copper, zinc, or any number of other elements known to be incorporated within a ceramic or dielectric material.

The electrostatic chuck body 325 may also include an embedded heater 350 contained within the chuck body. The heater 350 may include a resistive heater or a fluid heater in embodiments. In some embodiments the electrode 335 may be operated as the heater 350, but by decoupling these operations, more individual control may be afforded, and extended heater coverage may be provided while limiting the region for plasma formation. The heater 350 may include a polymer heater bonded or coupled with the chuck body material, although a conductive element may be embedded within the electrostatic chuck body and configured to receive current, such as AC current, to heat the top puck. The current may be delivered through the stem 330 through a similar channel as the DC power discussed above. The heater 350 may be coupled with a power supply 365, which may provide current to a resistive heating element to facilitate heating of the associated chuck body and/or substrate. The heater 350 may include multiple heaters in embodiments, and each heater may be associated with a zone of the chuck body 325, and thus, exemplary chuck bodies may include a similar number or greater number of zones than heaters. The chucking mesh electrode 335 may be positioned between the heater 350 and the substrate support surface 327 in some embodiments, and a distance may be maintained between the electrode within the chuck body and the substrate support surface in some embodiments as will be described further below.

The heater 350 may be capable of adjusting temperatures across the electrostatic chuck body 325, as well as a substrate residing on the substrate support surface 327. The heater 350 may have a range of operating temperatures to heat the chuck body and/or a substrate above or about 100° C., and the heater 350 may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater 350 may also be configured to operate in any range encompassed between any two of these stated numbers, or smaller ranges encompassed within any of these ranges. In some embodiments, the chuck heater may be operated to maintain a substrate temperature above at least 500° C. during deposition operations, such as forming stacks of material for memory devices as previously described. The heater 350 may also be configured to operator in the mentioned temperature ranges during cleaning processes.

As illustrated in FIG. 3, the chamber 300 may additionally include a cover plate 380 in some embodiments, and which may be placed within the processing region once a substrate has been removed subsequent processing, and prior to a cleaning operation. The cover plate 380 may be positioned on the substrate support surface 327 of the chuck body 325 of the substrate support assembly 310. In some embodiments, the chuck body 325 or the substrate support surface 327 may be referred to as a platen of the substrate support assembly 310. As explained previously, and described further below, during a cleaning process within the chamber 300, the cover plate 380 may prevent or reduce a build-up of halogen-containing contaminants in the chamber 300, such as aluminum fluoride, for example. As such, subsequent processed substrates may yield higher quality films, more consistent films, or both.

Figure 4:
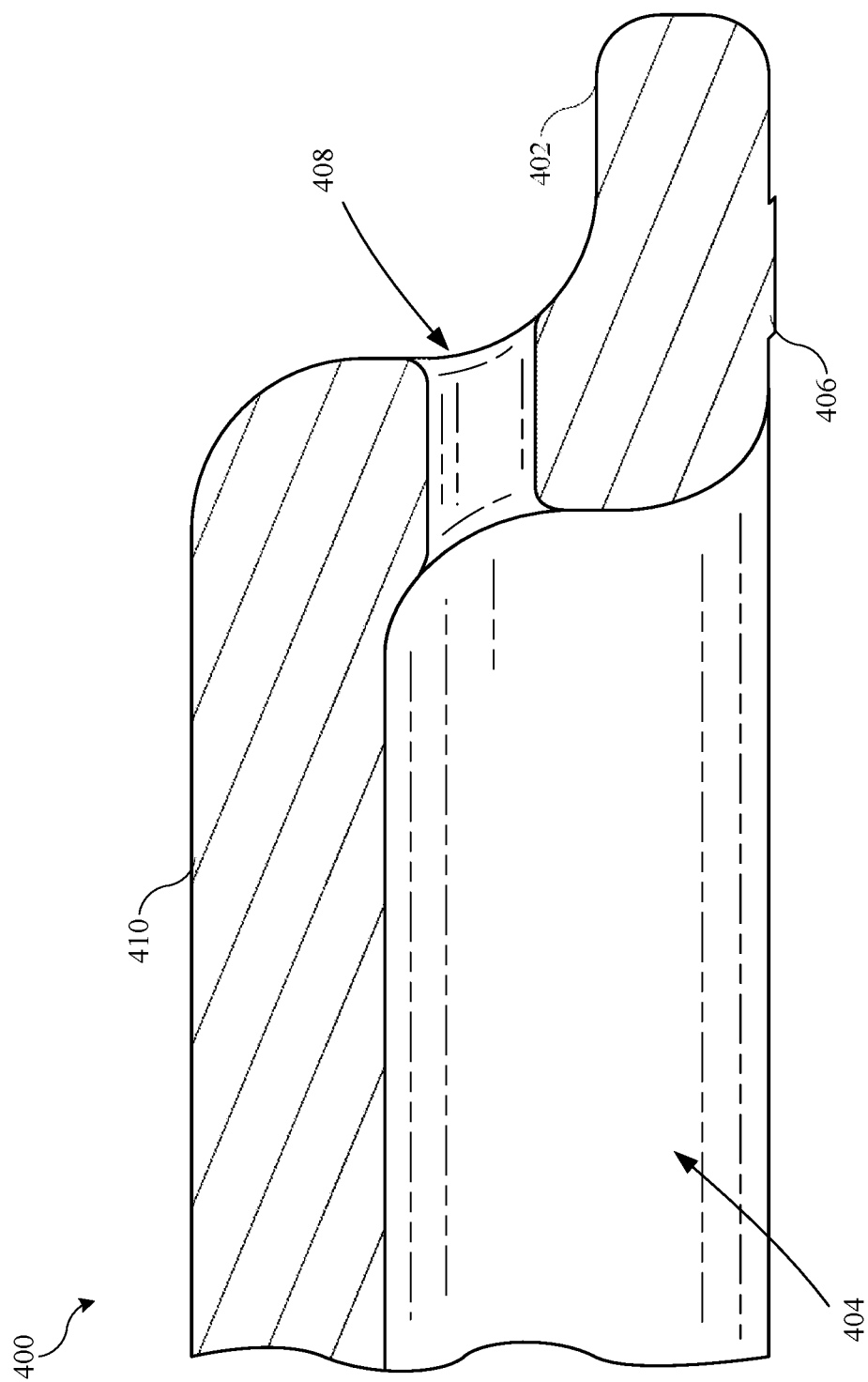
FIG. 4 shows a schematic partial cross-sectional view of a cover plate according to some embodiments of the present technology.

FIG. 4 shows a cross-sectional view of an exterior portion of a cover plate 400, according to some embodiments of the present technology. The cover plate shown in FIG. 4 may be similar or identical to the cover plate 380 of FIG. 3. As illustrated in FIG. 4, the cover plate 400 may include a number of features to accommodate processing operations and processing effects. Cover plate 400 may include a flange 402 extending about an exterior region of the cover plate 400. The flange may extend circumferentially about the cover plate, and may be configured to contact the platen of the substrate support assembly, and may provide a surface for seating the cover plate on the substrate support. Flange 402 may also limit an exposure access to an interior volume or region within the cover plate. Flange 402 may extend outward from the interior volume, and may extend to any radius to accommodate features of the substrate support. The flange may be characterized by a thickness configured to accommodate one or more features including a recessed pocket, an edge ring, or a shadow ring as will be described further below. For example, the flange may be characterized by a thickness of less than or about 5 mm, and may be characterized by a thickness of less than or about 4.5 mm, less than or about 4.0 mm, less than or about 3.5 mm, less than or about 3.0 mm, less than or about 2.5 mm, less than or about 2.0 mm, less than or about 1.5 mm, less than or about 1.0 mm, less than or about 0.5 mm, or less.

Additionally, the height of the flange 402 may be less than or about 85% of the height of the interior volume 404 from a surface of a substrate support on which the cover plate may be seated to an interior or backside surface along a central portion of the cover plate. Additionally, the flange may be characterized by a thickness of less than or about 80% of the height of the interior volume, less than or about 75% of the height of the interior volume, less than or about 70% of the height of the interior volume, less than or about 65% of the height of the interior volume, less than or about 60% of the height of the interior volume, less than or about 55% of the height of the interior volume, less than or about 50% of the height of the interior volume, less than or about 45% of the height of the interior volume, less than or about 40% of the height of the interior volume, or less. By reducing a thickness of the flange, the cover plate may be ensured to have limited interaction with other chamber components, such as a shadow ring, as will be described further below.

The length of the cover plate 400 may be such that the cover plate 400 may be seated on the substrate support surface 327 for any sized substrate support or surface geometry. The height of the internal volume of the cover plate may be less than or about 1.0% of the length of the cover plate 400, and may be less than or about 0.5% of the length, less than or about 0.3% of the length, less than or about 0.1% of the length, or less, which may facilitate transfer of the cover plate into and from the substrate processing chamber, as well as incorporation within a FOUP transferring a lot of substrates. However, in some embodiments the cover plate may be characterized by a diameter that is slightly less than the diameter of a substrate to ensure any edge or bevel deposition may be accessed and cleaned. Accordingly, in some embodiments, for whatever sized wafer may be processed, the cover plate may be characterized by a diameter that is greater than or about 0.01 mm less than the substrate diameter, and may be greater than or about 0.05 mm less than the substrate diameter, greater than or about 0.10 mm less than the substrate diameter, greater than or about 0.5 mm less than the substrate diameter, greater than or about 1.0 mm less than the substrate diameter, or more, although as the cover plate diameter further reduces, more of the substrate support surface may be exposed to cleaning effluents. Accordingly, the cover plate may be greater than or about 99% of the diameter of the substrate to be processed, or greater.

As explained previously, the substrate support may be at a higher temperature than many other components within the processing chamber. To limit heat transfer through the cover plate, the flange may have limited contact with the substrate support. For example, a number of protrusions 406 may be defined extending from the cover plate to produce contact points with a substrate support. Any number of protrusions may be defined by the cover plate, such as greater than or about 2, greater than or about 4, greater than or about 8, greater than or about 16, or more. However, the cover plate may heat faster with more protrusions, and thus in some embodiments the cover plate may define less than or about 15 protrusions, less than or about 12 protrusions, or less. Each protrusion may be characterized by dimensions to limit heat transfer as well as overall cover plate height. For example each protrusion may be characterized by a diameter of less than or about 5 mm, and may be characterized by a diameter of less than or about 4 mm, less than or about 3 mm, less than or about 2 mm, less than or about 1 mm, less than or about 0.5 mm, or less, which may limit heat transfer to the cover plate. Additionally, the protrusions may be characterized by a height or thickness of less than or about 1 mm, and may be characterized by a height of less than or about 0.5 mm, less than or about 0.1 mm, less than or about 0.05 mm or less.

The cover plate 400 may be vertically offset from the flange as shown, which may further increase a temperature gradient between the cover plate 400 and the substrate support, such as assembly 310 described above. The protrusion 406 may enhance the temperature gradient by reducing or eliminating solid heat conduction between the substrate support assembly 310 and the cover plate 400 by minimizing a contact area between the protrusion 406 and the substrate support surface 327. The temperature gradient may reduce or limit halogen interaction with the cover plate, which may be any of the materials describe previously, and may be the same material as the substrate support.

An aperture 408 may be defined through a sidewall of the cover plate 400 and may be configured to equalize pressure in the cover plate 400. For example, when vacuum is drawn within the processing chamber, a pressure differential may be formed within the cover plate, and which may cause the cover plate to move on the substrate support, which may affect uniformity of coverage, or may cause contact with other components, such as a shadow ring, when included. Any number of apertures may be formed about the cover plate, including greater than or about 2, greater than or about 4, greater than or about 8, greater than or about 16, or more, although with more apertures, additional access for plasma effluents may be provided. Accordingly, one or more apertures 408 may be formed through a sidewall of the cover plate that may be characterized by an aperture diameter of greater than or about 0.25 mm, and may be characterized by an aperture diameter of greater than or about 0.50 mm, greater than or about 0.75 mm, greater than or about 1.00 mm, greater than or about 1.25 mm, greater than or about 1.50 mm, greater than or about 1.75 mm, greater than or about 2.00 mm, or more. However, as aperture diameter increases, access for plasma effluents may increase, and thus the apertures may be sized to increase a probability of extinguishing plasma effluents at the aperture. Thus, in some embodiments the apertures may be characterized by an aperture diameter of less than or about 1.5 mm, less than or about 1.25 mm, or less.

An upper wall 410 of the cover plate 400 may be sized to limit cover plate weight, which may otherwise damage robot blades that may transfer the cover plate into and out of the processing chamber. Additionally, as the weight of the cover plate increases, the likelihood of scoring or scratching a substrate support may increase, as well as the thermal mass increasing the likelihood of increased cover plate heating. Accordingly, in some embodiments a thickness of the upper wall 410 may be less than or about 5 mm, and may be less than or about 4.5 mm, less than or about 4.0 mm, less than or about 3.5 mm, less than or about 3.0 mm, less than or about 2.5 mm, less than or about 2.0 mm, less than or about 1.5 mm, less than or about 1.0 mm, or less.

Figure 5:
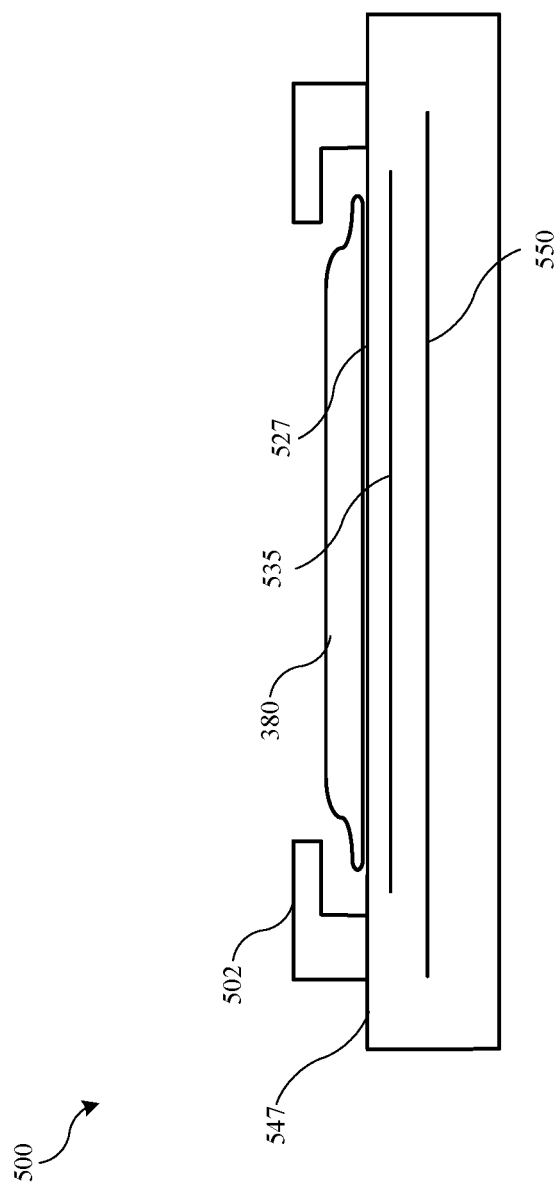
FIG. 5 shows a schematic partial cross-sectional view of chamber components according to some embodiments of the present technology.

FIG. 5 shows a schematic partial cross-sectional view of chamber components 500 according to some embodiments of the present technology. The cover plate 380 may include any feature or characteristic of cover plate 380 of FIG. 3, cover plate 400 of FIG. 4, or both. FIG. 5 may show similar components of FIG. 3 including a substrate support surface 527, an electrode 535, an exterior region 547, and a heating element 550. All of these components may be substantially similar in form and/or function to corresponding components as described above. Additionally, FIG. 5 may show embodiments in which a shadow ring 502 may be positioned or incorporated within the chamber.

Shadow rings may extend radially inward over an outer edge of a semiconductor substrate to limit deposition or processing over edge or bevel regions of the substrate. As described previously, the cover plate 380 may be positioned in the chamber subsequent to a processing or deposition cycle within the chamber 300. A processed substrate may be removed, and the cover plate 380 may be positioned on the substrate support within the chamber 300. The cover plate 380 may include the flange 402 as described with respect to FIG. 4, and the height of the flange 402 may be characterized by a thickness to limit or prevent interaction with the shadow ring 502. As a shadow ring may reside in the processing chamber and be engaged by a rising substrate support, the cover plate flange may be sized to ensure the components may not interact. For example, if the flange 402 was characterized by a larger height than as previously described, the cover plate 380 may strike or otherwise come in contact with the shadow ring. This contact may result in a damaged shadow ring 502 in some examples, and in other examples, this contact may move or dislodge the shadow ring, which may affect uniformity of an impact on a substrate being processed. With the height of the flange 402 being as previously described, contact between the cover plate 380 and the shadow ring 502 may be limited or prevented.

Figure 6:
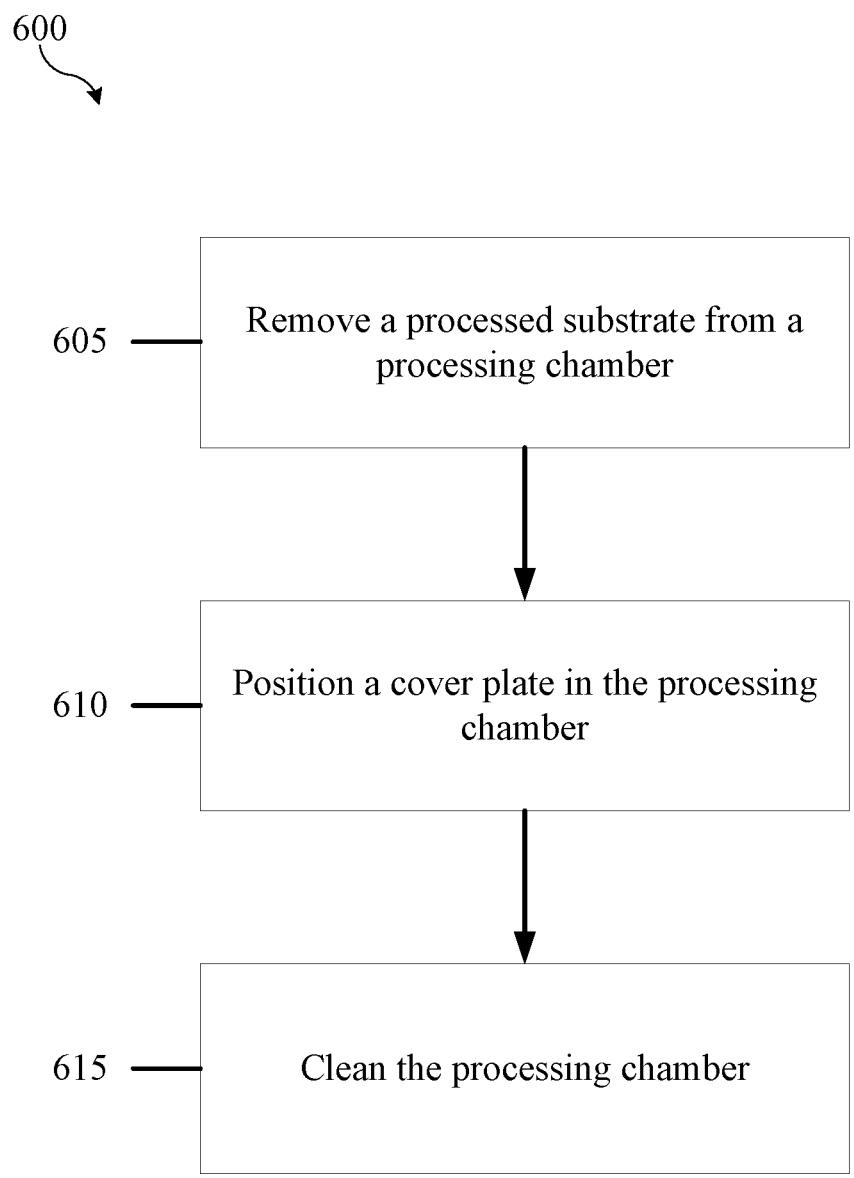
FIG. 6 shows operations of an exemplary method of semiconductor processing according to some embodiments of the present technology.

FIG. 6 shows a flow chart for a process 600 to clean a semiconductor processing chamber 300, according to some embodiments of the present technology. FIG. 6 shows operations of an exemplary process 600 of semiconductor processing according to some embodiments of the present technology. The process may be performed in a variety of processing chambers, including any of the chambers previously described, and which may include components according to embodiments of the present technology, such as any cover plate, or other component discussed previously. The process 600 may include a number of optional operations, which may or may not be specifically associated with some embodiments of methods according to the present technology. For example, in some embodiments the processes may include forming or depositing one or more materials on a substrate within a processing region of a semiconductor processing chamber.

Process 600 may include removing a processed substrate from a semiconductor processing chamber at operation 605. Once removed, a cover plate may be positioned within the processing chamber at operation 610, and which may be seated on the substrate support at a location exposed by the removal of the substrate.

The cover plate may be constructed of the same or similar material as the platen, and the cover plate may include a flange and an upper wall that may define a volume between the upper wall and a platen of the substrate support, as previously described. The cover plate may be characterized by any feature or aspect of any cover plate previously described. In embodiments in which a shadow ring may be included within the chamber, the method may include engaging a shadow ring, such as during raising the substrate support. A cleaning process may be performed at operation 615 within the semiconductor processing chamber 300. The cleaning process may involve flowing a halogen-containing gas or plasma effluents of a halogen-containing precursor, such as from a remote plasma unit, into the semiconductor processing chamber 300 for removing residual materials from the semiconductor processing chamber 300.

As explained above, based on the protrusions and other features of the cover plate, a temperature of the cover plate while seated on a heated substrate support, may be maintained at a temperature of less than or about 25° C. below a temperature of the substrate support, and may be maintained at a temperature of less than or about 30° C. below a temperature of the substrate support, less than or about 35° C. below a temperature of the substrate support, less than or about 40° C. below a temperature of the substrate support, less than or about 45° C. below a temperature of the substrate support, less than or about 50° C. below a temperature of the substrate support, less than or about 55° C. below a temperature of the substrate support, less than or about 60° C. below a temperature of the substrate support, less than or about 65° C. below a temperature of the substrate support, less than or about 70° C. below a temperature of the substrate support, less than or about 75° C. below a temperature of the substrate support, less than or about 80° C. below a temperature of the substrate support, less than or about 85° C. below a temperature of the substrate support, less than or about 90° C. below a temperature of the substrate support, or more.

By utilizing cover plates according to some embodiments of the present technology, during a cleaning process, the cover plate may mitigate or eliminate build-up of halogen-containing contaminants like aluminum fluoride. The cover plate may also protect exposed surfaces of a substrate support, which may increase component lifetime. This protection may also reduce erosion of the substrate support, which can impact leakage current, temperature uniformity, among any number of other characteristics of the component.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an aperture" includes a plurality of such apertures, and reference to "the protrusion" includes reference to one or more protrusions and equivalents thereof known to those skilled in the art, and so forth.

Also, the words "comprise(s)", "comprising", "contain(s) ", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing system comprising:
a chamber body comprising sidewalls and a base, the chamber body defining an internal volume;
a substrate support assembly having a shaft and a platen coupled with the shaft along a first surface of the platen, the substrate support assembly extending through the base of the chamber body, wherein the substrate support assembly is configured to support a substrate within the internal volume; and
a cover plate positioned on the platen of the substrate support assembly along a second surface of the platen opposite the first surface, the cover plate comprising:
a flange extending about an exterior region of the cover plate, wherein the flange has an outer diameter that is smaller than a diameter of the second surface of the platen such that a bottom surface of the flange is in direct contact with the second surface of the platen; and
an upper wall vertically offset from the flange, wherein an interior volume is defined between the upper wall and the platen of the substrate support assembly.

2. The semiconductor processing system of claim 1, wherein the cover plate is composed of the same material as the substrate support assembly.

3. The semiconductor processing system of claim 1, wherein the interior volume is characterized by a height of less than or about 5 mm.

4. The semiconductor processing system of claim 3, wherein the flange further comprises:
at least one protrusion extending from the flange and configured to contact the platen of the substrate support assembly, wherein the flange is characterized by a height of less than or about 50% of the height of the interior volume.

5. The semiconductor processing system of claim 4, wherein the at least one protrusion is characterized by a height of less than or about 0.5 mm.

6. The semiconductor processing system of claim 4, further comprising:
a shadow ring, wherein on engagement of the shadow ring with the substrate support assembly, the shadow ring is maintained free of contact with the flange of the cover plate.

7. The semiconductor processing system of claim 1, further comprising an aperture defined through the cover plate along a sidewall of the cover plate.

8. The semiconductor processing system of claim 1, wherein the upper wall is characterized by a thickness of less than or about 2 mm.

9. A semiconductor processing chamber cover plate comprising:
a flange extending about an exterior region of the cover plate, the flange defining a plurality of protrusions extending from a first surface of the flange; and
an upper wall vertically offset from the flange, wherein an interior volume is defined by the cover plate recessed from the first surface of the flange, wherein at least a portion of the flange extends radially outward from a peripheral edge of the upper wall.

10. The semiconductor processing chamber cover plate of claim 9, wherein the cover plate comprises a ceramic.

11. The semiconductor processing chamber cover plate of claim 9, wherein the interior volume is characterized by a height of less than or about 1.0% of a length of the cover plate.

12. The semiconductor processing chamber cover plate of claim 11, wherein the flange is characterized by a height of less than or about 50% of the height of the interior volume.

13. The semiconductor processing chamber cover plate of claim 12, wherein the plurality of protrusions are characterized by a height of less than or about 1 mm.

14. The semiconductor processing chamber cover plate of claim 9, further comprising an aperture defined through the cover plate along a sidewall of the cover plate.

15. The semiconductor processing chamber cover plate of claim 14, wherein the aperture is characterized by a diameter less than or about 50% of a height of the interior volume.

16. The semiconductor processing chamber cover plate of claim 14, wherein the aperture is characterized by a diameter of less than or about 1.5 mm.

17. The semiconductor processing chamber cover plate of claim 16, wherein the diameter is greater than or about 0.25 mm.

18. The semiconductor processing chamber cover plate of claim 9, wherein each of the plurality of protrusions comprises a diameter of less than or about 5 mm.

19. The semiconductor processing chamber cover plate of claim 9, wherein the plurality of protrusions comprises less than or about 15 protrusions.

\* \* \* \* \*